United States Patent
Dervay

(10) Patent No.: US 10,778,191 B1
(45) Date of Patent: Sep. 15, 2020

(54) ABSORPTIVE PHASE INVARIANT ATTENUATOR

(71) Applicant: Raytheon Company, Waltham, MA (US)

(72) Inventor: James Dervay, Franklin, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/724,866

(22) Filed: Dec. 23, 2019

(51) Int. Cl.
*H03L 5/00* (2006.01)
*H03H 11/24* (2006.01)

(52) U.S. Cl.
CPC ................ *H03H 11/24* (2013.01)

(58) Field of Classification Search
CPC ........ H03H 7/24; H03H 7/255; H03H 11/245; H03H 11/24; H01P 1/22; H01P 1/225; H03K 17/693; H03G 1/0088; H03G 1/007
USPC ............ 327/308; 333/24.1–24.3, 81 A, 81 R
See application file for complete search history.

(56) References Cited

U.S. PATENT DOCUMENTS

| 5,521,560 A | 5/1996 | Burns et al. |
| 6,104,986 A * | 8/2000 | Arevalo ................... H03H 7/20 |
| | | 702/106 |
| 6,911,879 B2 * | 6/2005 | Chiang ................... H01P 1/185 |
| | | 333/156 |
| 2017/0126181 A1 * | 5/2017 | Embar .................. H03F 1/0288 |

OTHER PUBLICATIONS

Nashimoto et al., "Reflection-Type Low-Phase-Shift Attenuator;" IEEE Transactions on Microwave Theory and Techniques, vol. 46, No. 7; Jul. 1998; 3 Pages.
Shireesha et al., "X-Band Voltage Variable Attenuators using PIN Diodes;" 2014 IEEE International Microwave and RF Conference (IMaRC); Dec. 15, 2014; 4 Pages.

* cited by examiner

*Primary Examiner* — Anh Q Tra
(74) *Attorney, Agent, or Firm* — Daly Crowley Mofford & Durkee, LLP

(57) ABSTRACT

Methods and apparatus for an absorptive, phase invariant signal attenuator. In embodiments, PIN diodes can be coupled to a hybrid coupler. Incident power can be split by the coupler to a terminating resistor, a terminating diode, and a series diode. The terminating diode becomes increasingly well matched and absorptive over the attenuation range. The series diode becomes increasingly mismatched and reflective over the attenuation range. The terminating resistor increasingly absorbs incident power as the coupling value decreases due to increasing diode impedance over the attenuation range.

19 Claims, 7 Drawing Sheets

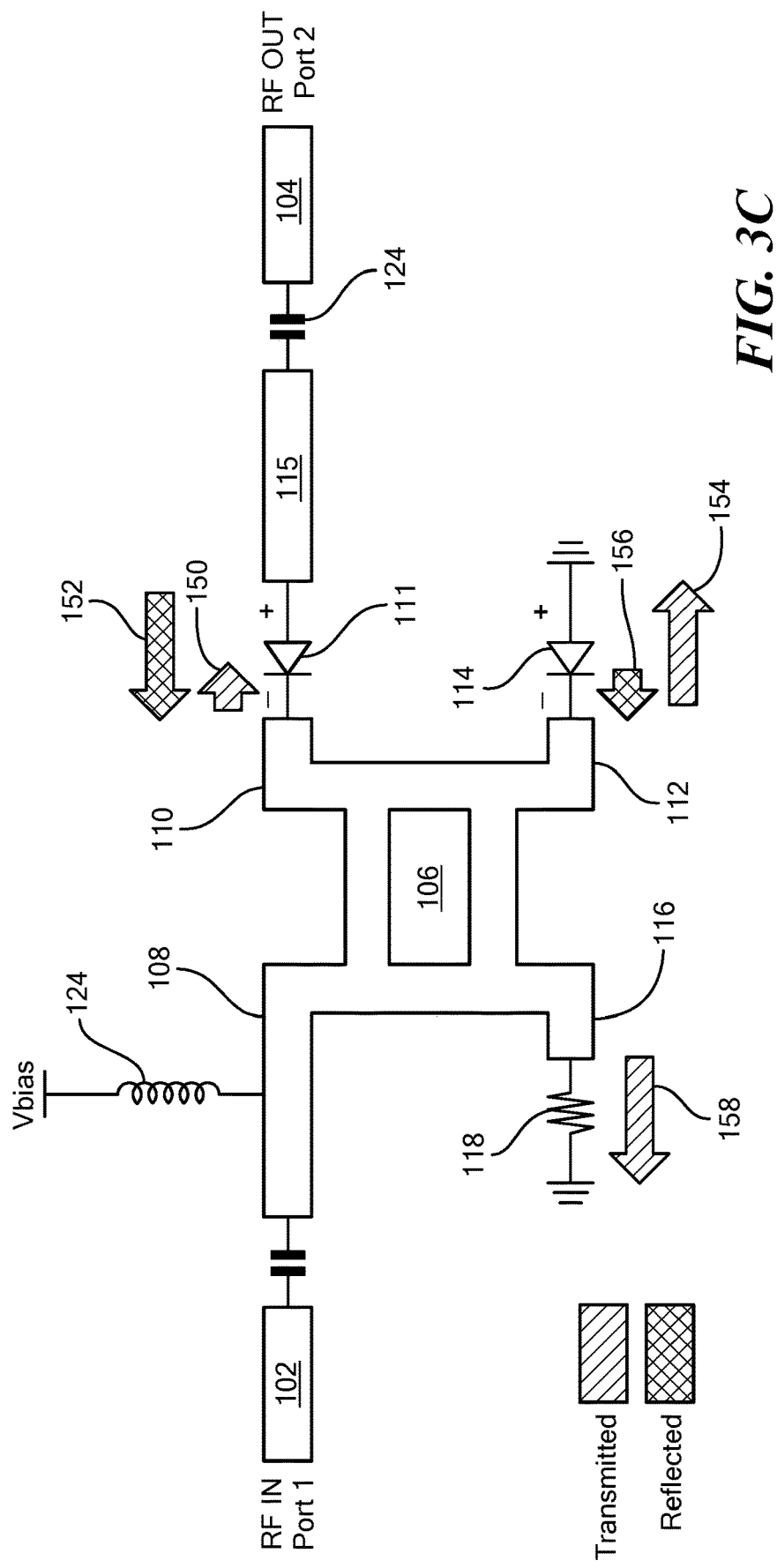

ABSORPTIVE PHASE INVARIANT ATTENUATOR

BACKGROUND

As is known in the art, it may be necessary to control or adjust optimal signal levels applied to certain electronic devices or components, such as radio transceivers, as well as to ensure that the specified power is transmitted from the system. Variable attenuators can be used for such purposes. However, conventional signal attenuators may introduce detrimental phase shifts and signal reflections.

Phased array radars typically use thousands of radiating elements behind which other circuitry can be located, such as amplifiers, phase shifters, attenuators, low noise amplifiers (LNAs), RF switches, etc. Components can be integrated into a common enclosure containing both transmit and receive circuitry. Know attenuators for such circuitry include voltage or current control for biasing components to obtain a desired signal attenuation level. Some conventional current or voltage controlled adjustable-type attenuators produce a variable insertion phase that varies with attenuation level due to the varying reactive effects of the control transistors or diodes used within the attenuator devices. This insertion phase may be sufficiently large so as to impact performance of the attenuator and degrade performance of the antenna.

SUMMARY

Embodiments of the invention provide methods and apparatus for an absorptive phase invariant signal attenuator for a given attenuation range for a selected frequency or frequency range. In embodiments, the attenuator includes a coupler having input and output ports and termination ports. Variable impedance devices, such as PIN diodes, can be coupled to coupler ports so that a terminating PIN diode becomes increasingly well-matched and absorptive over a given attenuation range and a series PIN diode at the output becomes increasingly mismatched and reflective over the given attenuation range.

In one aspect, a system for attenuating an input signal comprises: an input to receive the input signal; a terminating impedance element; a terminating diode; a series diode; and a coupler to split the input signal among the terminating impedance element, the terminating diode, and the series diode, wherein the terminating diode becomes more absorptive as an amount of attenuation increases, and wherein the series diode more reflective as the amount of attenuation increases.

The system can further include one or more of the following features: the terminating resistor absorbs more power from the coupler as the coupling value of the coupler decreases, the terminating impedance element comprises a resistor, the series diode comprises a PIN diode, an input terminal configured to receive a bias voltage for controlling an impedance of the series diode and the terminating diode, a transmission line coupled to the series diode, the coupler comprises a hybrid coupler, the system has an attenuation range for a given frequency of operation, and/or a first terminal to receive a first bias voltage for controlling an impedance of the series diode and a second terminal to receive a second bias voltage for controlling an impedance of the terminating diode.

In another aspect, a method comprises: receiving an input signal; employing a coupler to split the input signal among a terminating impedance element, a terminating diode, and a series diode, wherein the terminating diode becomes more absorptive as an amount of attenuation increases, and wherein the series diode more reflective as the amount of attenuation increases.

A method can further include one or more of the following features: the terminating resistor absorbs more power from the coupler as the coupling value of the coupler decreases, the terminating impedance element comprises a resistor, the series diode comprises a PIN diode, employing an input terminal configured to receive a bias voltage for controlling an impedance of the series diode and the terminating diode, coupling a transmission line to the series diode, the coupler comprises a hybrid coupler, the system has an attenuation range for a given frequency of operation, and/or employing a first terminal to receive a first bias voltage for controlling an impedance of the series diode and a second terminal to receive a second bias voltage for controlling an impedance of the terminating diode.

In a further aspect, a signal attenuator comprises: an input to receive an input signal; a means for terminating a signal; a terminating diode means; a series diode means; and a coupler means for splitting the input signal among the means for terminating a signal, the terminating diode means, and the series diode means, wherein the terminating diode means becomes more absorptive as an amount of attenuation increases, and wherein the series diode means is more reflective as the amount of attenuation increases.

BRIEF DESCRIPTION OF THE DRAWINGS

The foregoing features of this invention, as well as the invention itself, may be more fully understood from the following description of the drawings in which:

FIG. 3C shows signal characteristics for the signal attenuator of FIG. 1 in a high attenuation configuration;

DETAILED DESCRIPTION

Figure 1:
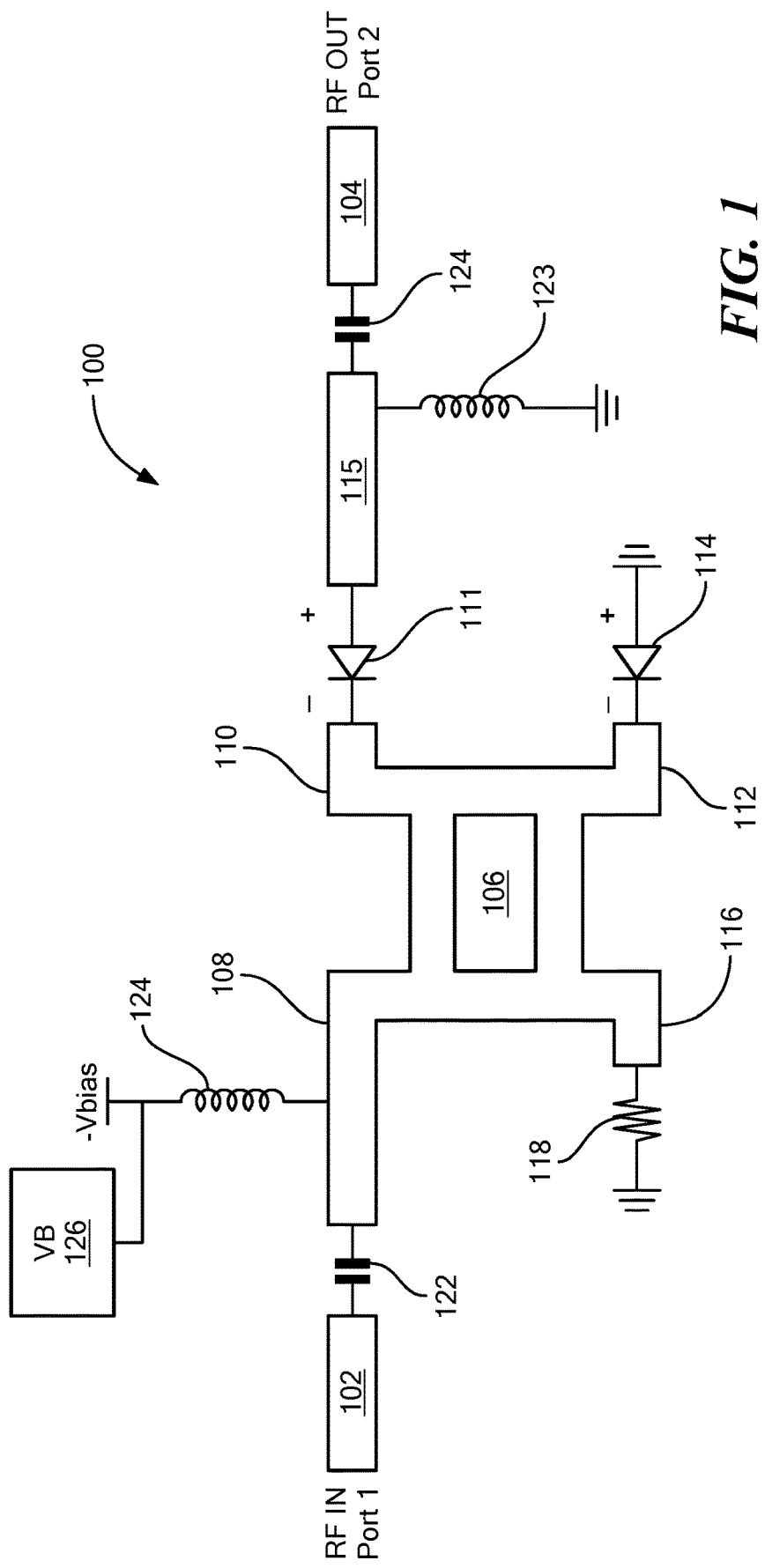
FIG. 1 is a diagram of an example signal attenuator according to example embodiments of the invention.
Figure 2:
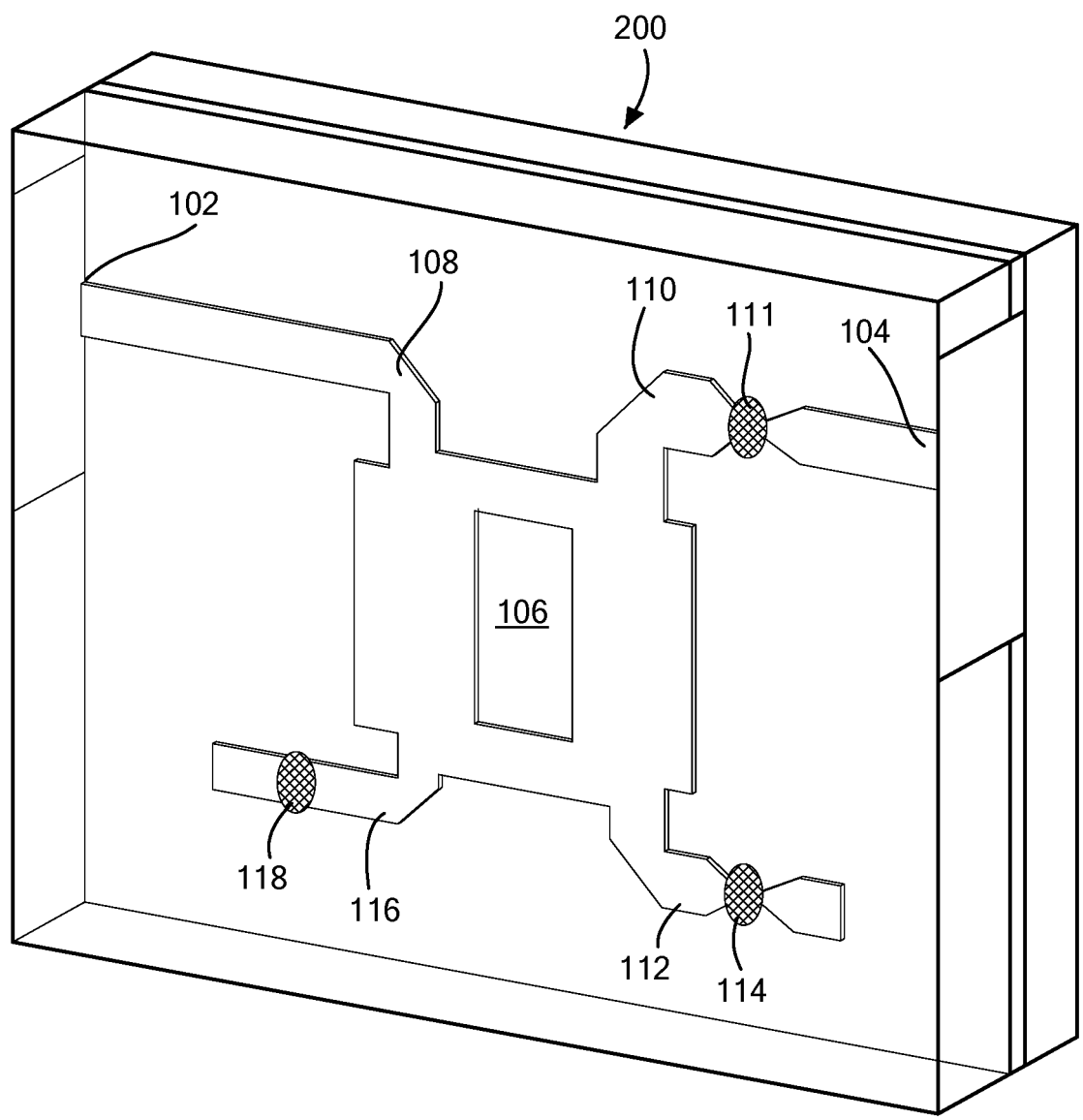
FIG. 2 is a schematic representation of an example implementation of the signal attenuator of FIG. 1.

FIG. 1 shows a schematic of an example signal attenuator 100 in accordance with example embodiments of the invention. The attenuator 100 has an input 102 and an output 104. In embodiments, the amount of signal attenuation from the input 102 to the output 104 can vary. In the illustrated embodiment, a coupler 106, such as a hybrid coupler, has a first port 108 coupled to the input 102, a second port 110 coupled to the output 104 via a first diode 111, a third port 112 coupled to a second diode 114, such as a PIN diode, and a fourth port 116 coupled to a terminating impedance element 118, such as a resistor. A transmission line 115, such as a 50 Ohm transmission line, can be coupled between the first diode 111 and the output 104. FIG. 2 shows an example microstrip configuration 200 of the signal attenuator of FIG. 1. An inductive ground path 123 may be required to complete the DC bias circuit for diode 111.

The attenuator 100 can also include an input blocking capacitor 122 and an output blocking capacitor 124. A bias voltage 124 can be connected to the coupler 106 to bias the PIN diodes 111, 114. A voltage bias control module 126 can provide a desired voltage bias level to the PIN diodes for controlling impedance. In example embodiments, the impedance of the first and second diodes 111, 114 ranges from about 5 Ohms to about 200 Ohms based upon the bias voltage 124. The resistance of the first diode 111 controls the transmission/reflection characteristics of the signal from the second port 110 of the coupler 106, which provides the output 104 of the attenuator 100. The resistance of the second diode 114 controls the absorption/reflection of the signal from the third port 112 of the coupler. In the illustrated embodiment, the coupler 106 comprises a 3 dB hybrid coupler.

In the illustrated embodiment, with regard to standard port naming for coupler, the second port 104 can be considered the isolated port, the third port 112 can be considered the coupled port, and the fourth port 116 can be considered the through port. It will be readily understood that the geometry and trace widths of the coupled will be determined by the particular operating characteristics for a given attenuator.

As known in the art, a PIN diode refers to a diode having an undoped semiconductor region between p-type and n-type semiconductor regions. The p-type and n-type regions may be doped to provide ohmic contacts. When the intrinsic region of the PIN diode is flooded with charge carriers, current flows through the diode. When the diode is forward biased, the injected carrier concentration is typically several orders of magnitude higher than the intrinsic carrier concentration.

Looking at signal absorption in the second diode 114, which can be considered a terminating diode, at a relatively low diode resistance, the second diode 114 is poorly matched, and thus reflects power to the first diode D1 111 and output 104 of the attenuator. The second diode 114 becomes increasingly well matched and absorptive with increasing resistance of the diode.

At relatively low diode resistance, the first diode 111 is well matched and easily passes the incident signal reflected from the second diode 114. The first diode 111 becomes increasingly mismatched and reflective with increasing diode resistance. Reflections from the first diode 111 are terminated in the second diode 114 and the first impedance element, e.g., resistor 118.

With regard to operation of the coupler 106, there may be a reduction of the coupling value through the illustrated hybrid coupler. At low diode resistance, the coupler 106 acts as a matched 3 dB coupler, with about half the power incident on the resistor 118 and about half on the second diode 114. The coupling value decreases with increasing diode resistance due to the changing impedance seen through the hybrid. Thus, more power is terminated in the resistor 118 and less power crosses the hybrid to the diode side (second diode 114).

In embodiments, the attenuator may be designed to operate at a particular frequency and attenuation range. For example, the frequency may have a bandwidth of two percent. In general, the minimum impedances of the series and terminating diodes correspond to minimum attenuation and maximum impedances correspond to maximum attenuation.

Figure 3A:
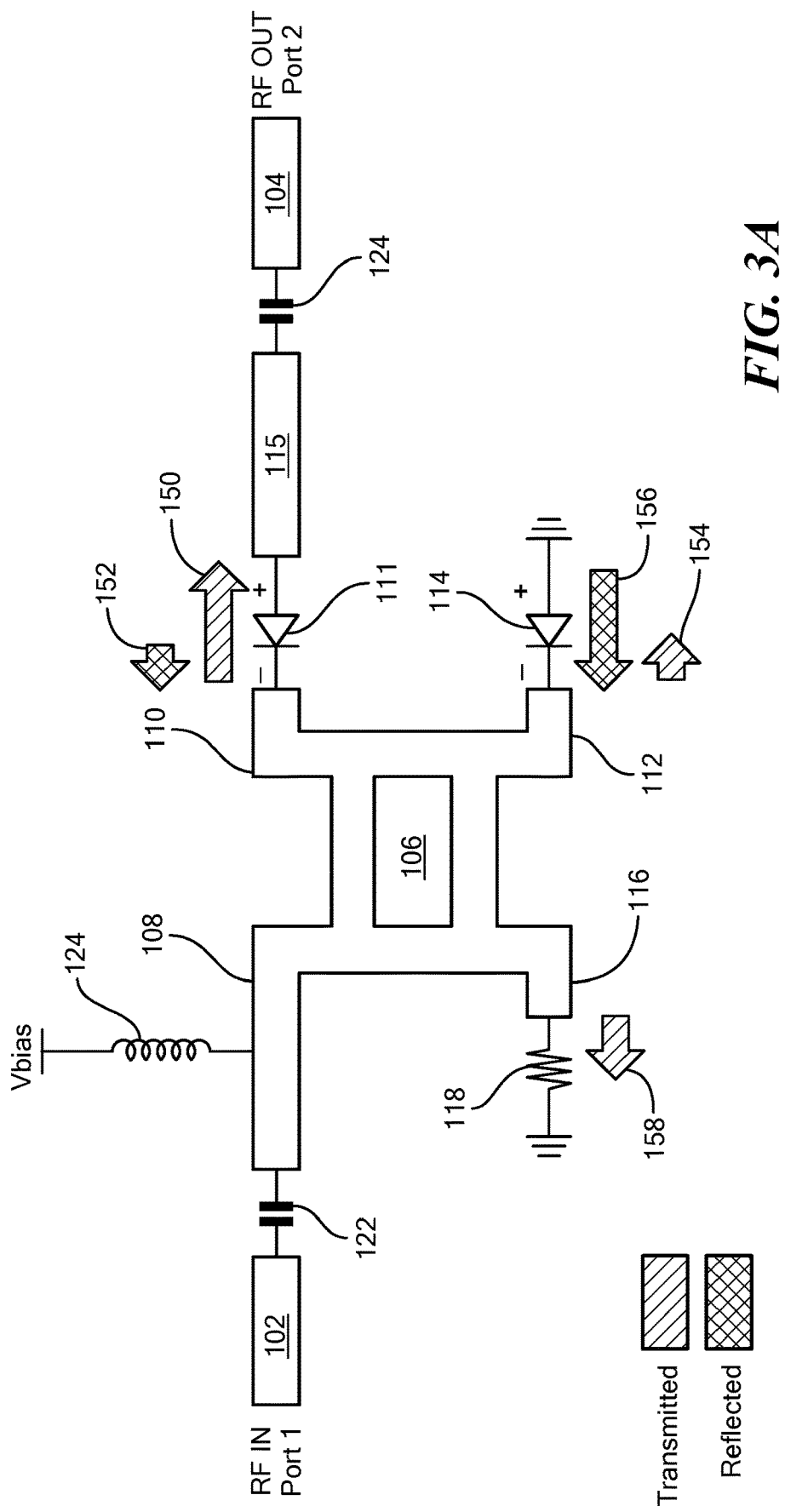
FIG. 3A shows signal characteristics for the signal attenuator of FIG. 1 in a low attenuation configuration.
Figure 3B:
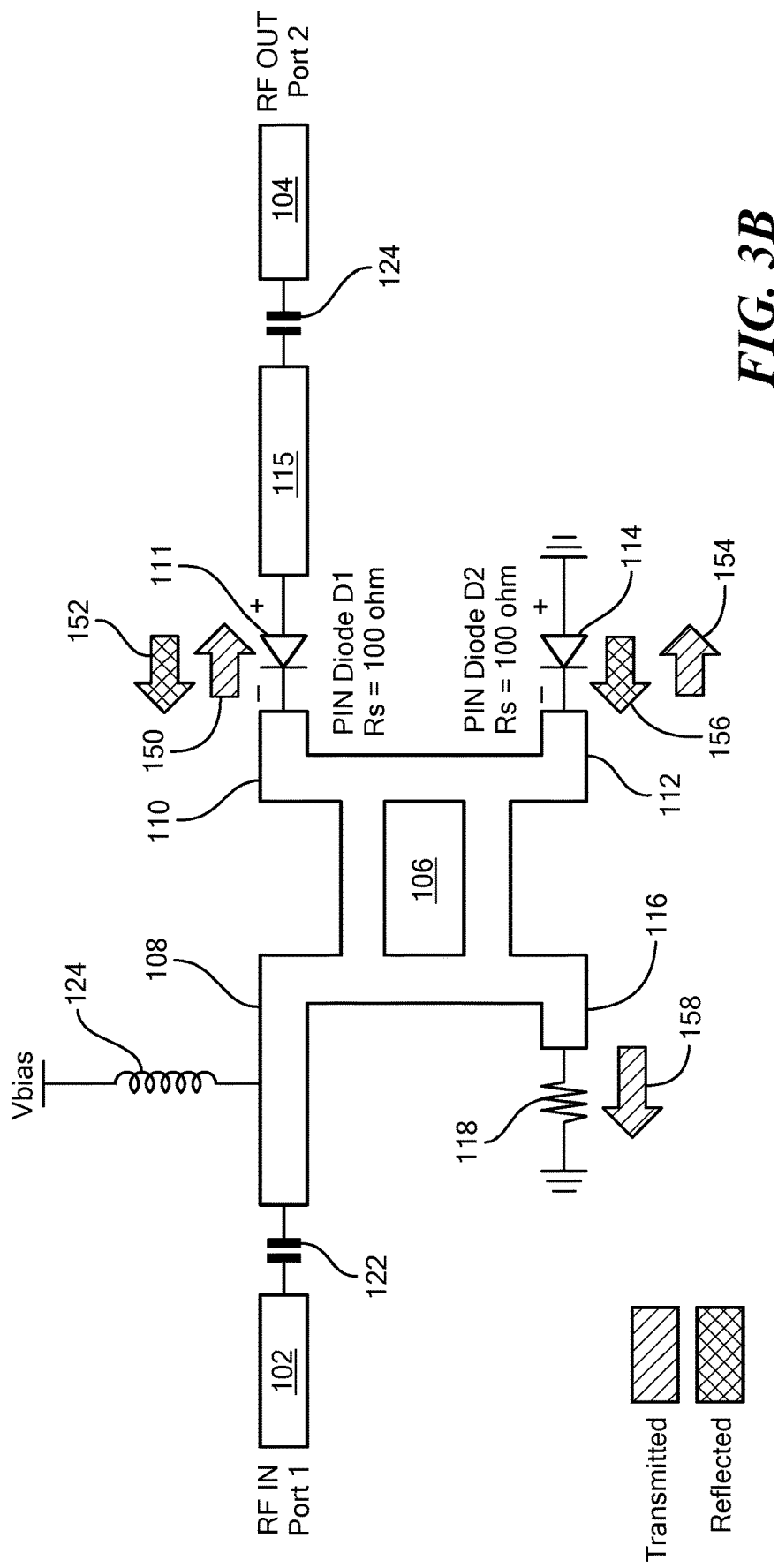
FIG. 3B shows signal characteristics for the signal attenuator of FIG. 1 in a medium attenuation configuration.

FIG. 3A shows the attenuator 100 of FIG. 1 in a low attenuation configuration having arrows to indicated transmission and reflection characteristics of the first and second diodes 111, 114. FIG. 3B shows the attenuator in a medium attenuation configuration and FIG. 3C shows the attenuator in a high attenuation configuration. It is understood that the attenuation configuration is determined by the bias voltage 124 which controls the impedance of the first and second diodes 111, 114. In the illustrated embodiments, a negative bias voltage 124 is used. In other embodiments, a positive bias voltage can be used.

In the low attenuation configuration of FIG. 3A, the first diode 111 is well matched in impedance and relatively transmissive. A first arrow 150 corresponding to transmission characteristics is significantly larger than a second arrow 152 corresponding to reflective characteristics. That is, in the low attenuation configuration, the first diode 111 is primarily transmissive at the second port 110 of the coupler.

The second diode 114 is poorly matched with regard to impedance and primarily reflective in the low attenuation configuration as can be seen from the relative size of the third arrow 154 (transmission) in relation to the fourth arrow 156 (reflection). It should be noted that while the first and second diodes 111, 114 have the same impedance set by the bias voltage 124, the first diode 111 is followed by the transmission line 115, which can be 50 Ohms, for example, and the second diode 114 is terminated into ground. The first and second diodes 111, 114 have the same impedance but different net impedances due to the circuit configuration. In addition, the coupler enhances the net impedance effects.

In the illustrated embodiment, the terminating impedance element 118, e.g., resistor, is coupled to ground. The relative signal through the terminating impedance element 118 is indicated by a fifth arrow 158. In embodiments, the coupler 106 comprises a 3 dB coupler in which a nominal 3 dB is lost in resistor 118 regardless of diode impedance.

In the example low attenuation configuration of FIG. 3A, the impedance of the first and second diodes 111, 114 can vary from about 5Ω to about 200Ω, for example. It is understood that the series and terminating diodes can have any practical impedance range to meet the needs of a particular application.

FIG. 3B shows attenuator 100 of FIG. 1 in a medium attenuation configuration in which the bias voltage 124 is adjusted so that the impedance of the first and second diodes 111, 114 is in a middle of the impedance range, e.g., 100Ω. In the illustrated embodiment, the transmission and reflection characteristics of the first and second diodes 111, 114 are about equal. As can be seen the first and second arrows 150, 152 for the first diode 111 are about equal in size, and similarly for the third and fourth arrows 154, 156 for the second diode. The fifth arrow 158 for the terminating resistor 118 may be slightly larger than the low attenuation configuration of FIG. 3A.

FIG. 3C shows the attenuator 100 of FIG. 1 in a high attenuation configuration in which the bias voltage 124 is adjusted so that the impedance of the first and second diodes 111, 114 is at the high end, or maximum, of the impedance range, e.g., 200Ω. It can be seen that the transmission and reflection characteristics of the first and second diodes 111, 114 are the opposite of the low attenuation configuration of FIG. 3A. The first arrow 150 corresponding to transmission of the first diode 111 is significantly smaller than the second arrow 152 corresponding to reflection. The third arrow 154 corresponding to transmission of the second diode 114 is significantly larger than the fourth arrow 156 corresponding to reflection.

In the illustrated embodiment, the power absorbed by the terminating impedance element 118 increases as the diode impedance changes, as indicated by the relative size of the fifth arrow 158, due to changes in the net coupling of the hybrid coupler 106, as less power crosses to the diode-side of the coupler.

Figure 4:
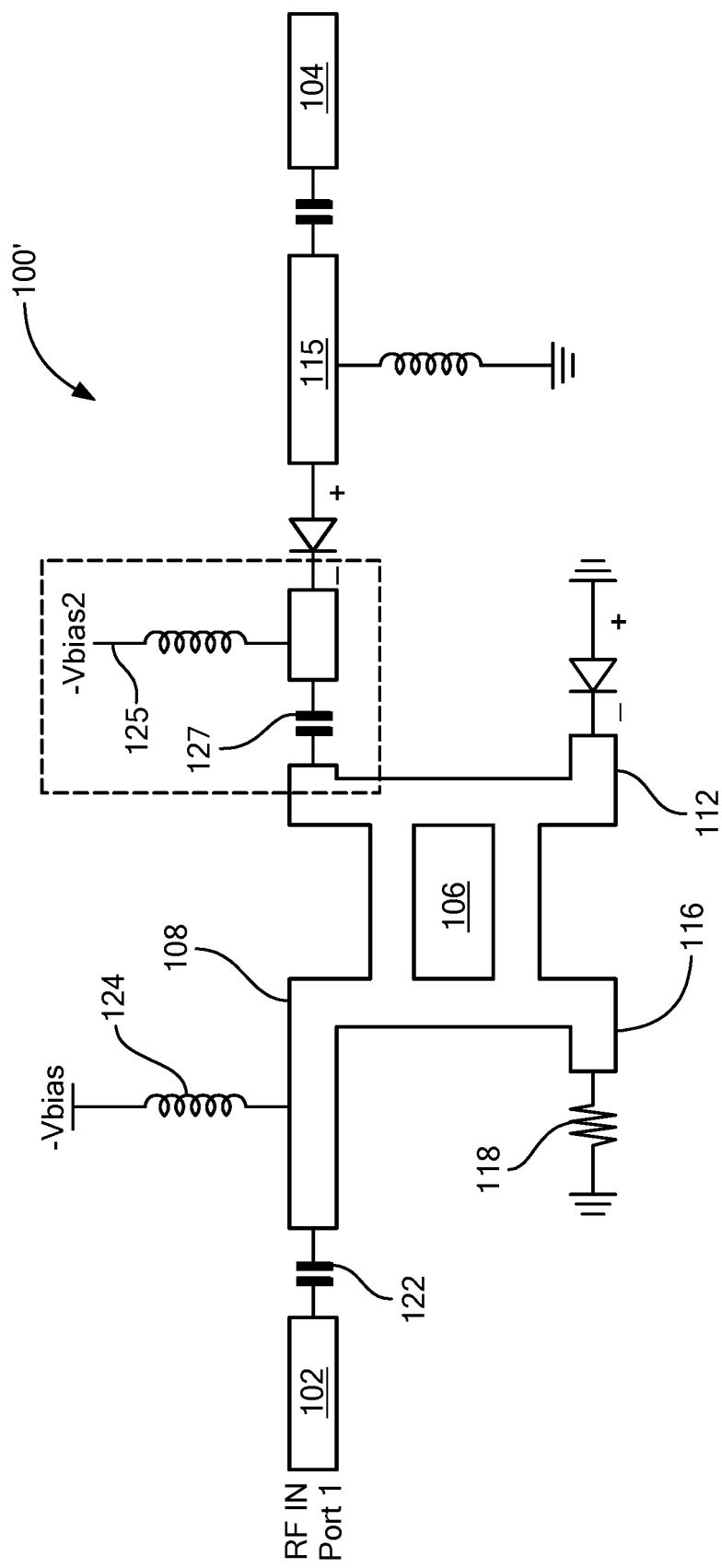
FIG. 4 is diagram of an example signal attenuator having multiple bias voltages.

FIG. 4 shows a further embodiment 100' of an attenuator similar to the attenuator 100 of FIG. 1 with a second bias voltage 125. In the illustrated embodiment, the second bias voltage 125 is isolated from the first bias voltage 124 by an additional blocking capacitor 127. With this arrangement, the impedance of the first and second diodes 111, 114 can be independently controlled. For example, a bias voltage lookup table and/or curve fitting can be calibrated to improve attenuator performance over a given attenuation range. Such an arrangement can mitigate the effects of diode parasitics and achieve increased attenuation range and decreased phase shift.

Figure 5:
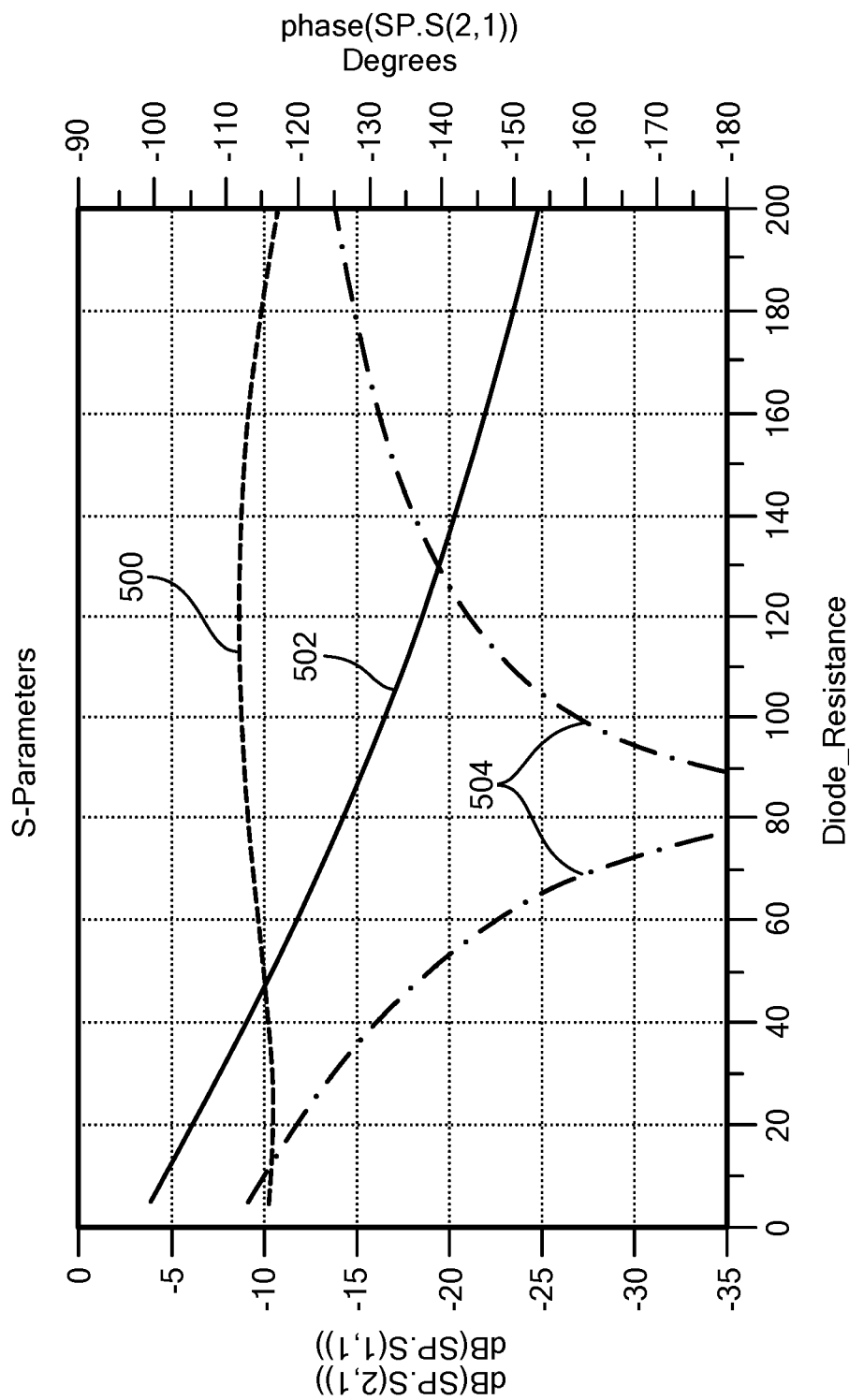
FIG. 5 is a waveform diagram of example signals for one embodiment of the signal attenuator of FIG. 1.

FIG. 5 shows waveforms for an example attenuator in accordance with example embodiments of the invention. The resistance of the first and second diodes 111, 114, varies from about 5 Ohms to about 200 Ohms. A phase response 500 is substantially flat across the impedance range of the first and second diodes. In embodiments, the phase response 500 varies less than plus/minus three degrees across the attenuation range.

The return loss (S11) 504 is low relative to conventional attenuators. Rather than reflecting power back to the source, most of the power is absorbed in the terminating resistor 118 and the terminating diode 112 over the attenuation range.

In example embodiments, a terminating impedance element, such as resistor 118 of FIG. 1, is used. While in many embodiments a purely resistive impedance may be desired, in some embodiments the terminating impedance element can comprise capacitive and/or inductive impedance characteristics for which the phase response may be taken into account. In addition, while PIN diodes are shown and described in example embodiments, in other embodiments, other components can be used, such as varactor diodes.

In embodiments, the series and terminating diodes are matched components. In other embodiments, the diodes may have different characteristics and impedances of these diodes may vary from each other to meet the needs of a particular application.

One skilled in the art will recognize the advantages of providing a signal attenuator having flat phase response and low return loss. Flat phase response is desired or required for many attenuator applications including bridge balancers, mixer drivers, and signal generators. Low return loss is desired or required in many attenuator applications to prevent reflections going back into sources such as amplifiers, circulators, and coupled lines Embodiments of a signal attenuator can be used in a wide variety of applications in which absorptive, phase-invariant attenuation is desirable. Example applications include sidelobe control in phased array antennas, mixer LO (local oscillator) driver in exciter/receiver up/down converters, automatic gain control (AGC) circuitry, AM modulators, and the like.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A system for attenuating an input signal, comprising:
an input to receive the input signal;
a terminating impedance element;
a terminating diode;
a series diode; and
a coupler to split the input signal among the terminating impedance element, the terminating diode, and the series diode,
wherein the terminating diode becomes more absorptive as an amount of attenuation increases, and
wherein the series diode more reflective as the amount of attenuation increases.

2. The system according to claim 1, wherein the terminating resistor absorbs more power from the coupler as the coupling value of the coupler decreases.

3. The system according to claim 1, wherein the terminating impedance element comprises a resistor.

4. The system according to claim 1, wherein the series diode comprises a PIN diode.

5. The system according to claim 1, further including an input terminal configured to receive a bias voltage for controlling an impedance of the series diode and the terminating diode.

6. The system according to claim 1, further including a transmission line coupled to the series diode.

7. The system according to claim 1, wherein the coupler comprises a hybrid coupler.

8. The system according to claim 1, wherein the system has an attenuation range for a given frequency of operation.

9. The system according to claim 1, further including a first terminal to receive a first bias voltage for controlling an impedance of the series diode and a second terminal to receive a second bias voltage for controlling an impedance of the terminating diode.

10. A method, comprising:
receiving an input signal;
employing a coupler to split the input signal among a terminating impedance element, a terminating diode, and a series diode,
wherein the terminating diode becomes more absorptive as an amount of attenuation increases, and
wherein the series diode more reflective as the amount of attenuation increases.

11. The method according to claim 10, wherein the terminating resistor absorbs more power from the coupler as the coupling value of the coupler decreases.

12. The method according to claim 10, wherein the terminating impedance element comprises a resistor.

13. The method according to claim 10, wherein the series diode comprises a PIN diode.

14. The method according to claim 10, further including employing an input terminal configured to receive a bias voltage for controlling an impedance of the series diode and the terminating diode.

15. The method according to claim 10, further including coupling a transmission line to the series diode.

16. The method according to claim 10, wherein the coupler comprises a hybrid coupler.

17. The method according to claim 10, wherein the system has an attenuation range for a given frequency of operation.

18. The method according to claim 10, further including employing a first terminal to receive a first bias voltage for controlling an impedance of the series diode and a second terminal to receive a second bias voltage for controlling an impedance of the terminating diode.

19. A signal attenuator, comprising:
- an input to receive an input signal;
- a means for terminating a signal;
- a terminating diode means;
- a series diode means; and
- a coupler means for splitting the input signal among the means for terminating a signal, the terminating diode means, and the series diode means,
- wherein the terminating diode means becomes more absorptive as an amount of attenuation increases, and
- wherein the series diode means is more reflective as the amount of attenuation increases.

* * * * *